United States Patent
Yang et al.

(10) Patent No.: US 10,725,371 B2
(45) Date of Patent: Jul. 28, 2020

(54) METHOD OF MANUFACTURING A SUBSTRATE OF A DISPLAY DEVICE AND MASK THEREOF

(71) Applicant: Wuhan China Star Optoelectronics Technology Co., Ltd., Wuhan, Hubei (CN)

(72) Inventors: Kun Yang, Hubei (CN); Xing Wang, Hubei (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 307 days.

(21) Appl. No.: 15/745,120

(22) PCT Filed: Oct. 12, 2017

(86) PCT No.: PCT/CN2017/105851
§ 371 (c)(1),
(2) Date: Jan. 15, 2018

(87) PCT Pub. No.: WO2019/061556
PCT Pub. Date: Apr. 4, 2019

(65) Prior Publication Data
US 2019/0384160 A1    Dec. 19, 2019

(30) Foreign Application Priority Data

Sep. 26, 2017    (CN) .......................... 2017 1 0884143

(51) Int. Cl.
*G03F 7/20*      (2006.01)
*G03F 1/38*      (2012.01)

(52) U.S. Cl.
CPC . *G03F 1/38* (2013.01); *G03F 7/20* (2013.01)

(58) Field of Classification Search
CPC ..... G03F 1/00; G03F 1/38; G03F 7/20; G03F 7/2002; G03F 7/201; G03F 7/70283
(Continued)

(56) References Cited

U.S. PATENT DOCUMENTS

| | | | |
|---|---|---|---|
| 2007/0031764 A1* | 2/2007 | Liou | G03F 7/0007 430/322 |
| 2011/0223393 A1* | 9/2011 | Hsiao | G03B 27/58 428/195.1 |

FOREIGN PATENT DOCUMENTS

| | | |
|---|---|---|
| CN | 101846888 A | 9/2010 |
| CN | 107219720 A * | 9/2017 |

OTHER PUBLICATIONS

Computer-generated translation of CN 107219720 (Sep. 2017). (Year: 2017).*

* cited by examiner

*Primary Examiner* — John A McPherson
(74) *Attorney, Agent, or Firm* — Hemisphere Law, PLLC; Zhigang Ma

(57) ABSTRACT

A method of manufacturing a substrate of a display device is provided. The method includes: providing a substrate body; coating a photoresist layer on the substrate body; exposing the photoresist layer by using a plurality lenses of an exposure machine through a mask, wherein the mask includes a light incident region and a light overlap region, the light overlap region includes a transparent zone and a non-transparent zone, and the light incident region includes a transparent zone and a non-transparent zone, and wherein an area of each transparent zone of the light overlap region is larger or smaller than an area of each transparent zone of the light incident region; and developing the photoresist layer after exposing to obtain a photoresist pattern. The embodiment of the disclosure also provides a mask applied (Continued)

to the method. By practice of the disclosure, the exposure pattern of the light overlap region could be compensated in order to obtain more accurate exposure pattern, so the product yield could be improved.

11 Claims, 3 Drawing Sheets

(58) Field of Classification Search
USPC .................................. 430/5, 7, 319, 321, 396
See application file for complete search history.

METHOD OF MANUFACTURING A SUBSTRATE OF A DISPLAY DEVICE AND MASK THEREOF

RELATED APPLICATIONS

The present application is a National Phase of International Application Number PCT/CN2017/105851, filed Oct. 12, 2017, and claims the priority of China Application No. 201710884143.7, filed Sep. 26, 2017.

FIELD OF THE DISCLOSURE

The disclosure relates to the technical field of display device, and particularly to an apparatus and a method of manufacturing a substrate of a display device and a mask applied to the substrate.

BACKGROUND

In the manufacturing process of thin film transistor liquid crystal display (TFT-LCD), in particular to the manufacturing process of array substrate or color filter substrate, the lithography process is applied in many steps. In the lithography process, project the pattern of the mask to the photoresist on the substrate by exposing the substrate with the photoresist via the mask with design pattern and the ultraviolet light of the exposure machine. In the manufacturing process of thin film transistor liquid crystal display (TFT-LCD), completing the manufacturing of array substrate and color filter substrate is need to applying the lithography process in many steps.

However, in the practice of the manufacturing process, the exposure machine has many sets of lenses, for example, an existing Nikon exposure machine has a light path system consisting of six sets of lenses. There is the ultraviolet light of multiple sets of lenses irradiating on the same region of the mask in the practice, which means that the lights of different lenses irradiate on a light overlap region of the mask. Because it is hard to adjust the lights of different lenses to the best target position, and the light intensity of the light overlap region and the light intensity of the center region of the lens have variations, the photoresist pattern obtained by passing through the light overlap region and the needed photoresist pattern (target photoresist pattern) have variations on key size. In general, the light intensity of the light overlap region is weaker than the light intensity of the center region of the lens. If using a negative photoresist, the thickness of the obtained photoresist pattern will be thinner than the thickness of the target photoresist pattern, due to the amount of the exposure is not enough in the light overlap region. If using a positive photoresist, the thickness of the obtained photoresist pattern will be thicker than the thickness of the target photoresist pattern, due to the amount of the exposure is too much. Therefore, the lens mura phenomenon will happen, and the phenomenon easily makes the yield of the small-size panel with high resolution decrease.

SUMMARY

The purpose of the disclosure is to overcome the disadvantage and the defect of the prior art. An apparatus and a method of manufacturing a substrate of a display device and a mask applied to the substrate are provided, so the exposure pattern of the light overlap region by using exposure machine with the different lenses could be compensated in order to obtain more accurate exposure pattern, and the product yield could be improved.

To achieve the above object, according to one aspect, the embodiment of the disclosure provides a method of manufacturing a substrate of a display device. The method includes: providing a substrate body; coating a photoresist layer on the substrate body; exposing the photoresist layer by using a plurality lenses of an exposure machine through a mask, wherein the mask includes a light incident region and a light overlap region, the light overlap region includes a transparent zone and a non-transparent zone, and the light incident region includes a transparent zone and a non-transparent zone, and wherein an area of each transparent zone of the light overlap region is larger or smaller than an area of each transparent zone of the light incident region; and developing the photoresist layer after exposing to obtain a photoresist pattern.

In one embodiment, the substrate includes an array substrate or a color filter substrate.

In one embodiment, when the photoresist layer coating on the substrate body is a negative photoresist, the area of each transparent zone of the light overlap region is larger than the area of each transparent zone of the light incident region.

In one embodiment, when the photoresist layer coating on the substrate body is a positive photoresist, the area of each transparent zone of the light overlap region is smaller than the area of each transparent zone of the light incident region.

According to another aspect, the embodiment of the disclosure provides a mask of exposing a photoresist layer coating on a substrate by using a plurality lenses of an exposure machine. The mask includes a light incident region and a light overlap region, the light incident region includes a transparent zone and a non-transparent zone, and the light overlap region includes a transparent zone and a non-transparent zone, wherein an area of each transparent zone of the light overlap region is larger or smaller than an area of each transparent zone of the light incident region.

In one embodiment, the substrate comprises an array substrate or a color filter substrate.

In one embodiment, when the photoresist layer coating on the substrate is a negative photoresist, the area of each transparent zone of the light overlap region is larger than the area of each transparent zone of the light incident region.

In one embodiment, when the photoresist layer coating on the substrate is a positive photoresist, the area of each transparent zone of the light overlap region is smaller than the area of each transparent zone of the light incident region.

Furthermore, according to another aspect, the embodiment of the disclosure provides a mask of exposing a photoresist layer coating on a substrate by using a plurality lenses of an exposure machine. The mask includes a light incident region and a light overlap region, the light incident region includes a transparent zone and a non-transparent zone, and the light overlap region includes a transparent zone and a non-transparent zone, wherein an area of each transparent zone of the light overlap region is larger or smaller than an area of each transparent zone of the light incident region, and wherein the substrate includes an array substrate or a color filter substrate.

In one embodiment, when the photoresist layer coating on the substrate is a negative photoresist, the area of each transparent zone of the light overlap region is larger than the area of each transparent zone of the light incident region.

In one embodiment, when the photoresist layer coating on the substrate is a positive photoresist, the area of each transparent zone of the light overlap region is smaller than the area of each transparent zone of the light incident region.

By applying the technical solution according to the embodiment of the disclosure, the transparent zone of the light overlap region could be compensated, which means that the area of the transparent zone could be increased or decreased in order to make the obtained exposure pattern on the overlap region on the substrate closer to the size of the target exposure pattern, so the more accurate exposure pattern could be obtained in order to reduce impact of the uneven light of lenses, so the product yield could be improved.

BRIEF DESCRIPTION OF THE DRAWINGS

Accompanying drawings are for providing further understanding of embodiments of the disclosure. The drawings form a part of the disclosure and are for illustrating the principle of the embodiments of the disclosure along with the literal description. Apparently, the drawings in the description below are merely some embodiments of the disclosure, a person skilled in the art can obtain other drawings according to these drawings without creative efforts. In the figures.

DETAILED DESCRIPTION OF PREFERRED EMBODIMENTS

The specific structural and functional details disclosed herein are only representative and are intended for describing exemplary embodiments of the disclosure. However, the disclosure can be embodied in many forms of substitution, and should not be interpreted as merely limited to the embodiments described herein.

The disclosure will be further described in detail with reference to accompanying drawings and preferred embodiments as follows.

Figure 1:
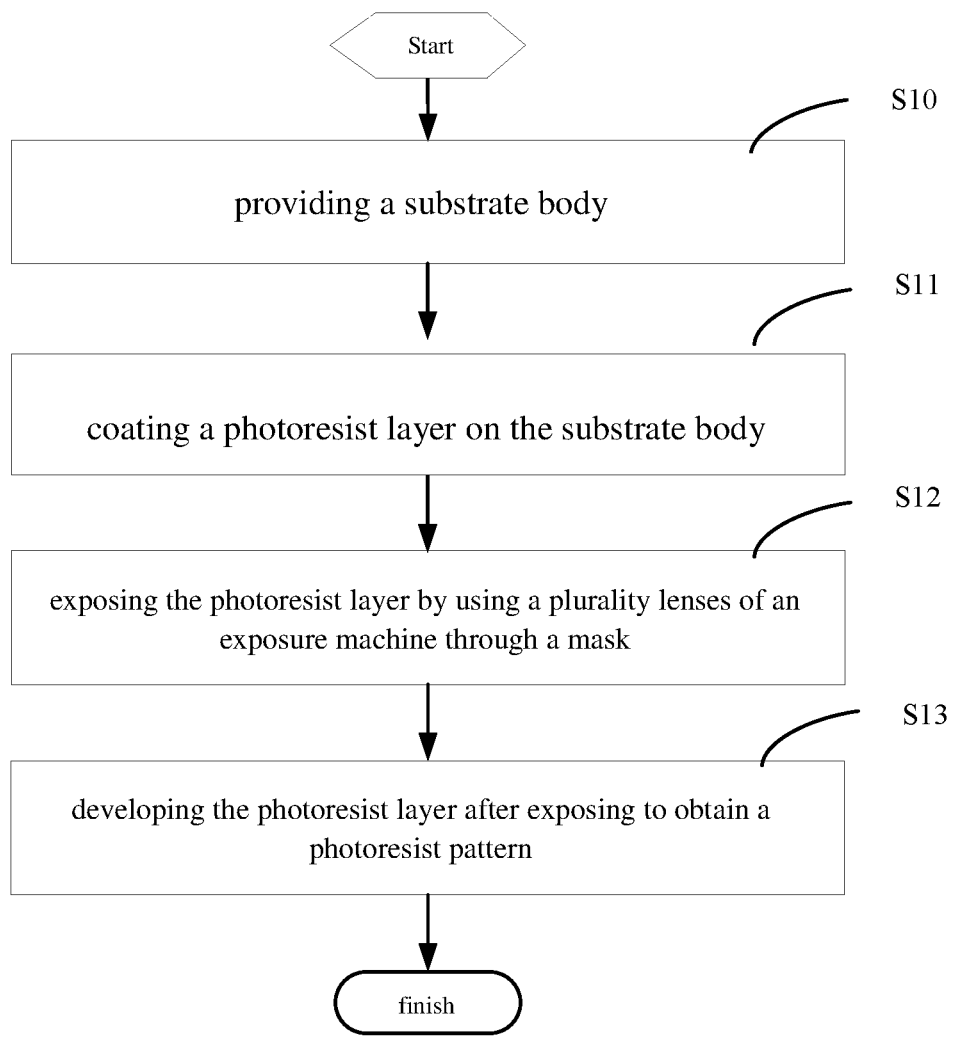
FIG. 1 is a main flow chart diagram of a method of manufacturing a substrate of a display device according to an embodiment of the disclosure.

As FIG. 1 shown, is a main flow chart diagram of a method of manufacturing a substrate of a display device according to an embodiment of the disclosure. In this embodiment, the method includes the following steps:

Step S10: providing a substrate body, for example, the substrate body is a transparent glass substrate, and the transparent glass substrate is need to be initially cleaned. In general, put the transparent glass substrate in a cleaning tank, and use chemical or physical method to remove the dust or the impurities on the surface of the transparent glass substrate in order to prevent the impact of the dust or the impurities on the following manufacturing.

Step S11: coating a photoresist layer on the substrate body, the photoresist layer may includes a positive photoresist or a negative photoresist.

Step S12: exposing the photoresist layer by using a plurality lenses of an exposure machine through a mask, wherein the mask includes a light incident region and a light overlap region, the light overlap region includes a transparent zone and a non-transparent zone, and the light incident region includes a transparent zone and a non-transparent zone, and wherein when the photoresist layer coating on the substrate body is a negative photoresist, an area of each transparent zone of the light overlap region is larger than an area of each transparent zone of the light incident region. In this situation, by increasing the area of transparent zone to increase the total intensity of the passing light. In another situation, when the photoresist layer coating on the substrate body is a positive photoresist, the area of each transparent zone of the light overlap region is smaller than the area of each transparent zone of the light incident region, so the total intensity of the passing light through the transparent zone of the light overlap region could be decreased.

Step S13: developing the photoresist layer after exposing to obtain a photoresist pattern.

It should be noted that the substrate may include an array substrate or a color filter substrate, and the method could apply to the manufacturing process of the array substrate or the color filter substrate.

Figure 2:
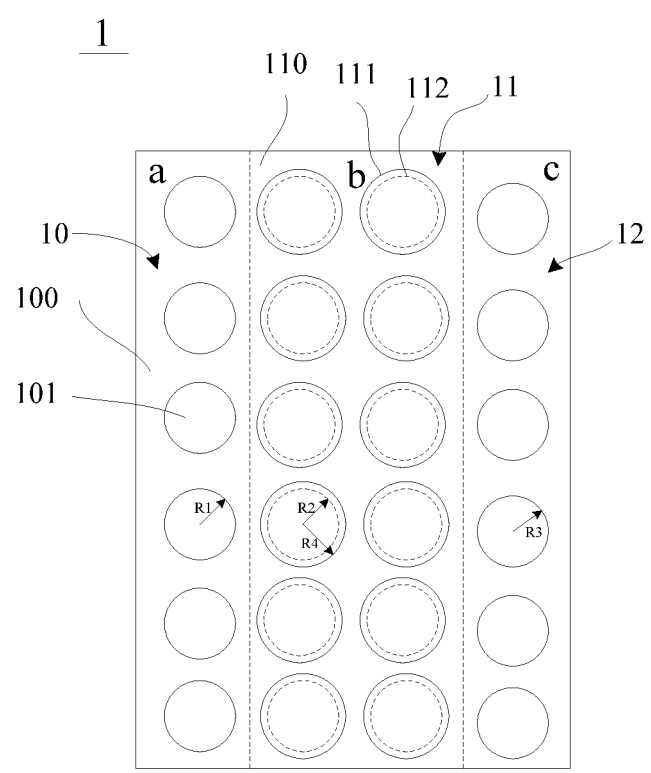
FIG. 2 is a structural schematic view of the mask in FIG. 1 according to an embodiment of the disclosure.

Specifically, as FIG. 2 shown, is a structural schematic view of the mask in FIG. 1 according to an embodiment of the disclosure. Use the mask in FIG. 2 when the photoresist layer coating on the substrate body is a negative photoresist. In this embodiment, the mask of the substrate is used for exposing the photoresist layer by using a plurality lenses of an exposure machine. The mask 1 includes light incident regions 10, 12 and a light overlap region 11, wherein the light of a lens covers region a and region b, and the light of another lens covers region c and region b, which means that region a is the light incident region 10 of the first lens, region c is the light incident region 12 of the second lens, and region b is the light overlap region 11 of the first lens and the second lens.

The light overlap region 11 includes a transparent zone 111 and a non-transparent zone 110, and the light incident region 10 includes a transparent zone 101 and a non-transparent zone 100. An area of each transparent zone 111 of the light overlap region 11 is larger than an area of each transparent zone 101 of the light incident region 10, and an area of a dotted line zone 112 of the transparent zone 101 is equal to the area of the transparent zone 101, which means that R4>R1=R2=R3. Specifically, the area of each transparent zone 111 of the light overlap region 11 could completely cover the area of each transparent zone 101 of the light incident region 10, each transparent zone 111 of the light overlap region 11 includes the area of the transparent zone 101 of the light incident region 10 (i.e. the area of the dotted line zone 112 included) and the compensation area (the area outside the dotted line zone 112 in the transparent zone 111). It should be noted, in some embodiments, different compensation areas could be selective, for example, selecting the compensation area smaller than 1/10 of the area of the transparent zone 101 of the light incident region 10. The dotted line zone 112 just for easily understanding, there is no dotted line zone 112 in the mask in practice.

Figure 3:
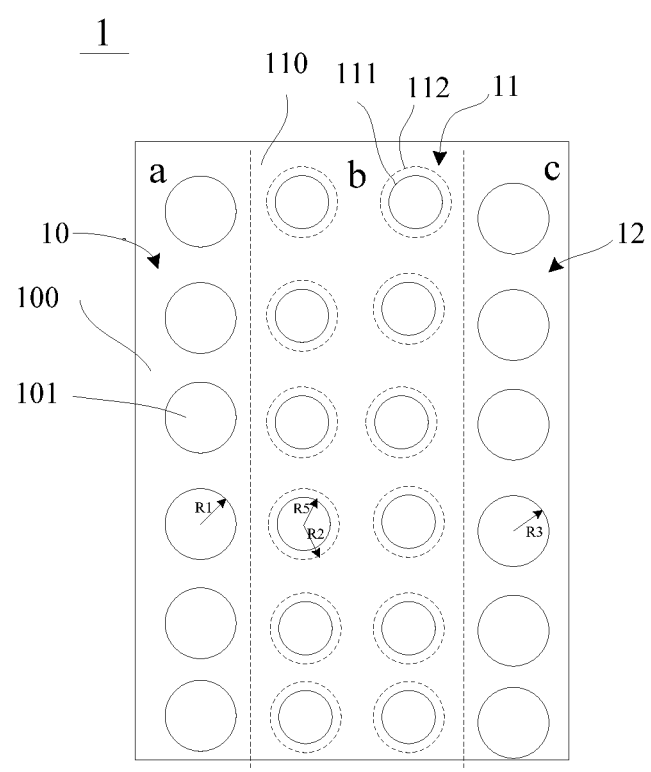
FIG. 3 is a structural schematic view of the mask in FIG. 1 according to another embodiment of the disclosure.

It should be noted that use the mask in FIG. 3 when the photoresist layer coating on the substrate body is a positive photoresist. After the step S13 in FIG. 1, because the area of each transparent zone 111 of the light overlap region 11 is reduced, the light intensity of each transparent zone 111 could be decreased in order to obtain the suitable thickness of the exposure region.

It should be noted that the transparent zone and the exposure pattern are circle in FIG. 2 and FIG. 3 just for an example, in some embodiments, the transparent zone and the exposure pattern may include other shapes, such as rectangle, ellipse, trapezoid and so on, or the combination of the above-mentioned shapes.

In summary, by applying the technical solution according to the embodiment of the disclosure, the transparent zone of the light overlap region could be compensated, which means that the area of the transparent zone could be increased or decreased in order to make the obtained exposure pattern on the overlap region on the substrate closer to the size of the target exposure pattern, so the more accurate exposure pattern could be obtained in order to reduce impact of the uneven light of lenses, so the product yield could be improved.

It should be noted that the terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element.

The foregoing contents are detailed description of the disclosure in conjunction with specific preferred embodiments and concrete embodiments of the disclosure are not limited to this description. For the person skilled in the art of the disclosure, without departing from the concept of the disclosure, simple deductions or substitutions can be made and should be included in the protection scope of the application.

What is claimed is:

1. A method of manufacturing a substrate of a display device, comprising:
    providing a substrate body;
    coating a photoresist layer on the substrate body;
    exposing the photoresist layer by using a plurality lenses of an exposure machine through a mask, wherein the mask comprises a light incident region and a light overlap region, the light overlap region includes transparent zones and a non-transparent zone, and the light incident region includes transparent zones and a non-transparent zone, and wherein an area of each of the transparent zones of the light overlap region is larger or smaller than an area of each of the transparent zones of the light incident region to form a compensation area smaller than 1/10 of the area of the transparent zone of the light incident region; and
    developing the photoresist layer after exposing to obtain a photoresist pattern;
    wherein the transparent zones of the light overlap region are spaced from one another in a lengthwise direction of the light overlap region, and each of the transparent zones of the light overlap region is enclosed by the non-transparent zone of the light overlap region;
    wherein the transparent zones of the light incident region are spaced from one another in the lengthwise direction, and each of the transparent zones of the light incident region is enclosed by the non-transparent zone of the light incident region;
    wherein the light overlap region and the light incident region are arranged in a widthwise direction of the light overlap region perpendicular with the lengthwise direction.

2. The method of manufacturing a substrate of a display device according to claim 1, wherein the substrate comprises an array substrate or a color filter substrate.

3. The method of manufacturing a substrate of a display device according to claim 1, wherein when the photoresist layer coating on the substrate body is a negative photoresist, the area of each transparent zone of the light overlap region is larger than the area of each transparent zone of the light incident region.

4. The method of manufacturing a substrate of a display device according to claim 1, wherein when the photoresist layer coating on the substrate body is a positive photoresist, the area of each transparent zone of the light overlap region is smaller than the area of each transparent zone of the light incident region.

5. A mask of exposing a photoresist layer coating on a substrate by using a plurality lenses of an exposure machine, comprising:
    a light incident region, the light incident region includes transparent zones and a non-transparent zone; and
    a light overlap region, the light overlap region includes transparent zones and a non-transparent zone;
    wherein an area of each of the transparent zones of the light overlap region is larger or smaller than an area of each of the transparent zones of the light incident region to form a compensation area smaller than 1/10 of the area of the transparent zone of the light incident region;
    wherein the transparent zones of the light overlap region are spaced from one another in a lengthwise direction of the light overlap region, and each of the transparent zones of the light overlap region is enclosed by the non-transparent zone of the light overlap region;
    wherein the transparent zones of the light incident region are spaced from one another in the lengthwise direction, and each of the transparent zones of the light incident region is enclosed by the non-transparent zone of the light incident region;
    wherein the light overlap region and the light incident region are arranged in a widthwise direction of the light overlap region perpendicular with the lengthwise direction.

6. The mask of exposing a photoresist layer coating on a substrate by using a plurality lenses of an exposure machine according to claim 5, wherein the substrate comprises an array substrate or a color filter substrate.

7. The mask of exposing a photoresist layer coating on a substrate by using a plurality lenses of an exposure machine according to claim 5, wherein when the photoresist layer coating on the substrate is a negative photoresist, the area of each transparent zone of the light overlap region is larger than the area of each transparent zone of the light incident region.

8. The mask of exposing a photoresist layer coating on a substrate by using a plurality lenses of an exposure machine according to claim 5, wherein when the photoresist layer coating on the substrate is a positive photoresist, the area of each transparent zone of the light overlap region is smaller than the area of each transparent zone of the light incident region.

9. A mask of exposing a photoresist layer coating on a substrate by using a plurality lenses of an exposure machine, comprising:
    a light incident region, the light incident region includes transparent zones and a non-transparent zone; and
    a light overlap region, the light overlap region includes transparent zones and a non-transparent zone;

wherein an area of each transparent zone of the light overlap region is larger or smaller than an area of each transparent zone of the light incident region to form a compensation area smaller than 1/10 of the area of the transparent zone of the light incident region;

wherein the substrate comprises an array substrate or a color filter substrate;

wherein the transparent zones of the light overlap region are spaced from one another in a lengthwise direction of the light overlap region, and each of the transparent zones of the light overlap region is enclosed by the non-transparent zone of the light overlap region;

wherein the transparent zones of the light incident region are spaced from one another in the lengthwise direction, and each of the transparent zones of the light incident region is enclosed by the non-transparent zone of the light incident region;

wherein the light overlap region and the light incident region are arranged in a widthwise direction of the light overlap region perpendicular with the lengthwise direction.

10. The mask of exposing a photoresist layer coating on a substrate by using a plurality lenses of an exposure machine according to claim 9, wherein when the photoresist layer coating on the substrate is a negative photoresist, the area of each transparent zone of the light overlap region is larger than the area of each transparent zone of the light incident region.

11. The mask of exposing a photoresist layer coating on a substrate by using a plurality lenses of an exposure machine according to claim 9, wherein when the photoresist layer coating on the substrate is a positive photoresist, the area of each transparent zone of the light overlap region is smaller than the area of each transparent zone of the light incident region.

* * * * *